(12) United States Patent
Yen et al.

(10) Patent No.: US 8,362,591 B2
(45) Date of Patent: Jan. 29, 2013

(54) INTEGRATED CIRCUITS AND METHODS OF FORMING THE SAME

(75) Inventors: Hsiao-Tsung Yen, Tainan (TW); Hsien-Pin Hu, Zhubei (TW); Jhe-Ching Lu, Tainan (TW); Chin-Wei Kuo, Zhubei (TW); Ming-Fa Chen, Taichung (TW); Sally Liu, HsinChu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 177 days.

(21) Appl. No.: 12/795,734

(22) Filed: Jun. 8, 2010

(65) Prior Publication Data

US 2011/0298551 A1 Dec. 8, 2011

(51) Int. Cl.
*H01L 29/93* (2006.01)
(52) U.S. Cl. . 257/595; 257/602; 257/774; 257/E29.344; 257/E21.364
(58) Field of Classification Search .................. 257/602, 257/774, E29.344, E21.364, 595
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnsorth et al. | |

(Continued)

FOREIGN PATENT DOCUMENTS

CN 1829074 A 9/2006
JP 2003-318417 11/2003

OTHER PUBLICATIONS

Jung, B. et al., "Power Optimized LC VCO & Mixer Co-design", Proceedings of the 2005 IEEE International Symposium on Circuits and Systems (ISCAS), 5:4393-4396.

(Continued)

*Primary Examiner* — Tan N Tran
(74) *Attorney, Agent, or Firm* — Duane Morris LLP

(57) ABSTRACT

A three-dimensional integrated circuit includes a semiconductor substrate where the substrate has an opening extending through a first surface and a second surface of the substrate and where the first surface and the second surface are opposite surfaces of the substrate. A conductive material substantially fills the opening of the substrate to form a conductive through-substrate-via (TSV). An active circuit is disposed on the first surface of the substrate, an inductor is disposed on the second surface of the substrate and the TSV is electrically coupled to the active circuit and the inductor. The three-dimensional integrated circuit may include a varactor formed from a dielectric layer formed in the opening of the substrate such that the conductive material is disposed adjacent the dielectric layer and an impurity implanted region disposed surrounding the TSV such that the dielectric layer is formed between the impurity implanted region and the TSV.

14 Claims, 9 Drawing Sheets

U.S. PATENT DOCUMENTS

| | | |
|---|---|---|
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,369,008 B2 | 5/2008 | Masai et al. |
| 2009/0109121 A1* | 4/2009 | Herz et al. .................. 343/912 |
| 2010/0035370 A1* | 2/2010 | Ding et al. .................. 438/29 |

OTHER PUBLICATIONS

Heng, C.H. et al., "Techniques for Improving CMOS VCO Performance", IEEE International Symposium on Radio-Frequency Integration Technology, 2009, pp. 182-186.

Dudulwar, K. et al., "Design and Analysis of Low Power Low Phase Noise VCO", International Conference MIXDES 2006, pp. 256-259.

Nicolson, S.T. et al., "Design and Scaling of SiGe BiCMOS VCOs Above 1000 GHz", IEEE Proceeding of BCTM, 2006, pp. 142-145.

Official Action issued Aug. 2, 2012 in counterpart Chinese Patent Application.

* cited by examiner

INTEGRATED CIRCUITS AND METHODS OF FORMING THE SAME

FIELD OF THE INVENTION

The present disclosure is directed generally to integrated circuits. In particular, the present disclosure relates to integrated circuit structures including through-substrate-vias.

DESCRIPTION OF THE RELATED ART

Developments in integrated circuit technology have often focused on improving the integration density of various electronic components (e.g. transistors, capacitors, diodes, resistors, inductors, etc.) into a given chip or wafer area. Various improvements have involved the reduction of minimum component size, permitting more components to be integrated on the surface of the semiconductor die. Such two-dimensional (2D) integration density improvements are physically limited by device size, the size of the die, and other limitations including the complexity of design, such as, for example, the requisite length and number of interconnections between devices, and the corresponding circuit delay and power consumption increases.

Three-dimensional (3D) integrated circuits and stacked wafers or dies are conventionally used to resolve some of the limitations of 2D integrated circuit developments. Openings formed in semiconductor substrates to provide a stacked wafer/die packaging structure are conventionally referred to as through-substrate-vias (TSV). TSVs are often used in stacked wafer/die packaging structures to connect the wafers or dies. The total interconnect length of the integrated circuits has been found to decrease as the number of dies or wafers increased in the 3D stack.

In Radio Frequency (RF) communication systems, such as cellular telephony, cordless phone, wireless data networks, two way paging, global positioning systems (GPS), etc., stringent requirements are placed on the system such as low phase noise, low power consumption and wide tuning range. In such systems, the voltage controlled oscillator (VCO) is one of the most significant building blocks because it defines key performance requirements for the RF communication system. Conventionally, VCOs utilize the resonance of a parallel LC-tank circuit (LC-VCO) as a local oscillator. The LC-VCO includes inductors and variable capacitors, or varactors, which are electrically coupled in parallel to each other to form a parallel LC-tank circuit. The resonance of the LC-tank circuit causes an AC signal to be delivered at a resonant frequency. A resonant frequency is a frequency at which the reactance of the inductor equals the reactance of the capacitor, and the oscillation refers to a phenomenon in which a current flows alternately through the inductors and varactors in a parallel LC-tank circuit. The capacitance of the varactor is adjusted to thereby control the frequency of the oscillating AC signal.

FIG. 1 is a circuit diagram showing a conventional LC-VCO and FIG. 2 is a plan view showing a portion of a conventional LC-VCO. As illustrated in FIG. 1, a conventional LC-VCO 100 is connected to a supply potential Vcc and a ground potential GND. An inductor section 150, a varactor section 160, a negative resistance section 170 and a current regulation section 180 are connected with one another from the supply potential line Vcc towards the ground potential line GND in the LC-VCO 100. The inductor section 150 is provided with two spiral inductors 102a and 102b. Ends of the spiral inductors 102a and 102b are connected to the supply potential Vcc and the other ends are connected to output terminals 106a and 106b. The varactor section 160 is provided with two varactors 104a and 104b. One end of the varactor 104a, such as a well electrode, is connected to the output terminal 106a, while one end of the varactor 104b, such as a well electrode, is connected to the output terminal 106b. The varactor 104a and 104b are connected to each other at the other ends thereof, e.g., at the gate electrodes, to which a control voltage is applied. The negative resistance section 170 is provided with NMOS transistors 108a and 108b. The NMOS transistor 108a has the drain connected to the output terminal 106a and the gate connected to the output terminal 106b. On the other hand, the NMOS transistor 108b has the drain connected to the output terminal 106b and the gate connected to the output terminal 106a. The current regulation section 180 is provided with NMOS transistors 110a and 110b. The NMOS transistor 110a has the drain connected to the sources of the N-channel transistor 108a and the N transistor 108b. Additionally, the NMOS transistor 110a has the source connected to the ground potential line GND and the gate to which a bias voltage is applied. The NMOS transistor 110b has the drain connected to the sources of the N-channel transistor 108a and the NMOS transistor 108b. Additionally, the NMOS transistor 110b has the source connected to the ground potential line GND and the gate to which a bias voltage is applied.

FIG. 2 illustrates a layout of a portion of a conventional LC-VCO 200. As shown in FIG. 2, the LC-VCO 200 is provided in a semiconductor integrated circuit device in which multilayer interconnection layer 228 are deposited on a semiconductor substrate (not shown). A spiral inductor 202 is deposited in one of the topmost inter-layer dielectric (ILD) layers of the multilayer interconnection layer 228. The performance of inductors disposed on wafer substrates at RF frequencies is dependent upon substrate resistivity. As the substrate resistivity decreases, the eddy currents that can circulate in the substrate at these frequencies get larger and cause energy losses (dissipation) in the substrate. Such energy losses will lower the inductor quality factor, or Q factor, which has many noise implications in the LC-VCO 200. Guard ring 214 is provided surrounding spiral inductor 202 to prevent such substrate capacitive or inductive coupling between spiral inductor 202 and interconnect 218 or other components. A capacitive element formed region, where a capacitor 216 and a varactor 206 are formed, is located outside of the underlying region of spiral inductor 202 on the surface of the semiconductor substrate (not shown). The capacitive element formed region can also be located outside of the underlying region of spiral inductor 202 and at a separate location of the multilayer interconnection layer 228. Capacitor 216 typically is a metal-oxide-metal (MOM) capacitor or a metal-insulator-metal (MIM) capacitor. Additionally, no other elements or conductors such as interconnects 218 are formed in the underlying region of the spiral inductor 202. In this manner, the conventional LC-VCO 200 layout is designed such that a guard-ring 214 surrounds and isolates the spiral inductor 202. The spiral inductor 202 is deposited in one of the topmost ILD layers of the multilayer interconnection layer 228, with no elements such as capacitors, varactors or transistors or conductors being deposited in the region of the spiral inductor 202. This design is intended to prevent magnetic fields created in the spiral inductor 202 from having an adverse effect on the operation of active elements or from inducing a current flowing through conductors to cause power loss. However, this design results in a much larger layout area for the LC-VCO 200.

One of the most important factors in a tuned parallel LC-tank circuit is the quality factor Q, which relates the reactance of the tuned circuit to its resistance (i.e., relates the energy stored to the energy dissipated in the circuit per cycle). The quality factor is limited by parasitic losses within the substrate itself. These losses can include high resistance through the metal layers of the inductor. To achieve a high quality factor, resistance in the inductor should be held to a minimum, thereby reducing the energy dissipated. Thus, one approach to minimizing the resistance of the inductor involves increasing the thickness of metal used to fabricate the inductor. In this approach, integrated inductors may have a decreased resistance because of a much thicker top metal layer. However, this ultra thick metal (UTM) layer involves complicated processing and a relatively high cost.

SUMMARY OF THE INVENTION

One embodiment of the present invention provides a varactor for a voltage-controlled oscillator (VCO) including a semiconductor substrate having an opening extending through a first surface and a second surface of the substrate. The first surface and the second surface are opposite surfaces of the substrate. A dielectric layer is disposed on a side surface in the opening. A conductive material is formed on the dielectric layer and substantially filling the opening to form a conductive through-substrate-via (TSV) and an impurity implanted region disposed in the substrate surrounding the TSV and the dielectric layer.

Another embodiment of the present invention provides a method of forming a varactor including the steps of providing a substrate, forming an opening in a first surface of the substrate, implanting impurities in a side wall surrounding the opening, forming a dielectric layer on the implanted side wall in the opening and substantially filling the opening with a conductive material.

A further embodiment of the present invention provides a three-dimensional integrated circuit including a semiconductor substrate. The substrate has an opening extending through a first surface and a second surface of the substrate. The first surface and the second surface are opposite surfaces of the substrate. A conductive material substantially fills the opening to form a conductive through-substrate-via (TSV). An active circuit is disposed on the first surface of the substrate, and an inductor disposed on the second surface of the substrate. The TSV is electrically coupled to the active circuit and the inductor.

BRIEF DESCRIPTION OF THE DRAWINGS

Various aspects of the present disclosure will be or become apparent to one with skill in the art by reference to the following detailed description when considered in connection with the accompanying exemplary non-limiting embodiments.

DETAILED DESCRIPTION OF THE EMBODIMENTS OF THE INVENTION

With reference to the Figures where like elements have been given like numerical designations to facilitate an understanding of the present invention, the various embodiments of a varactor and method of forming the same is provided.

Figure 1:
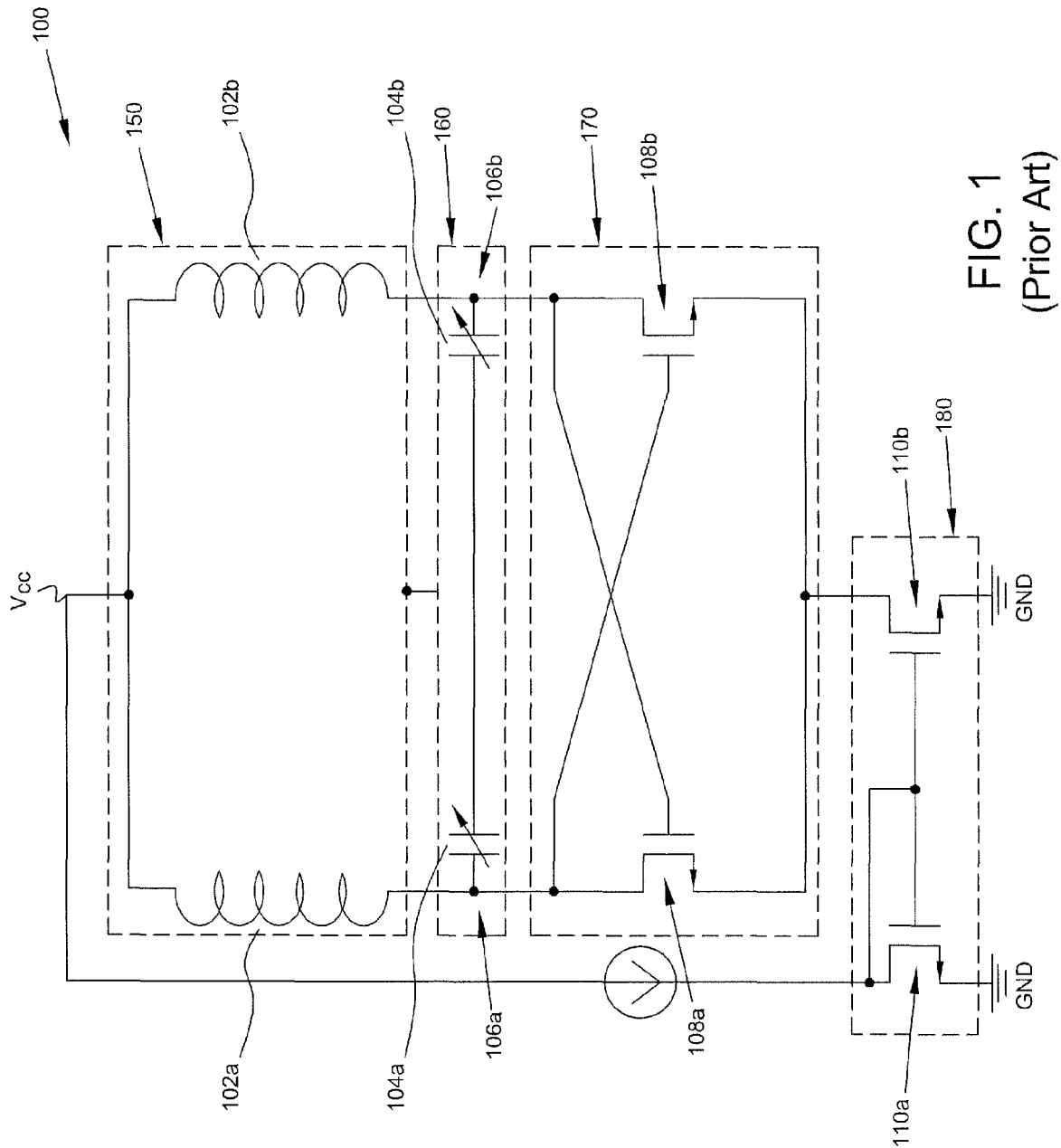
FIG. 1 is a circuit diagram of a conventional LC-VCO.
Figure 2:
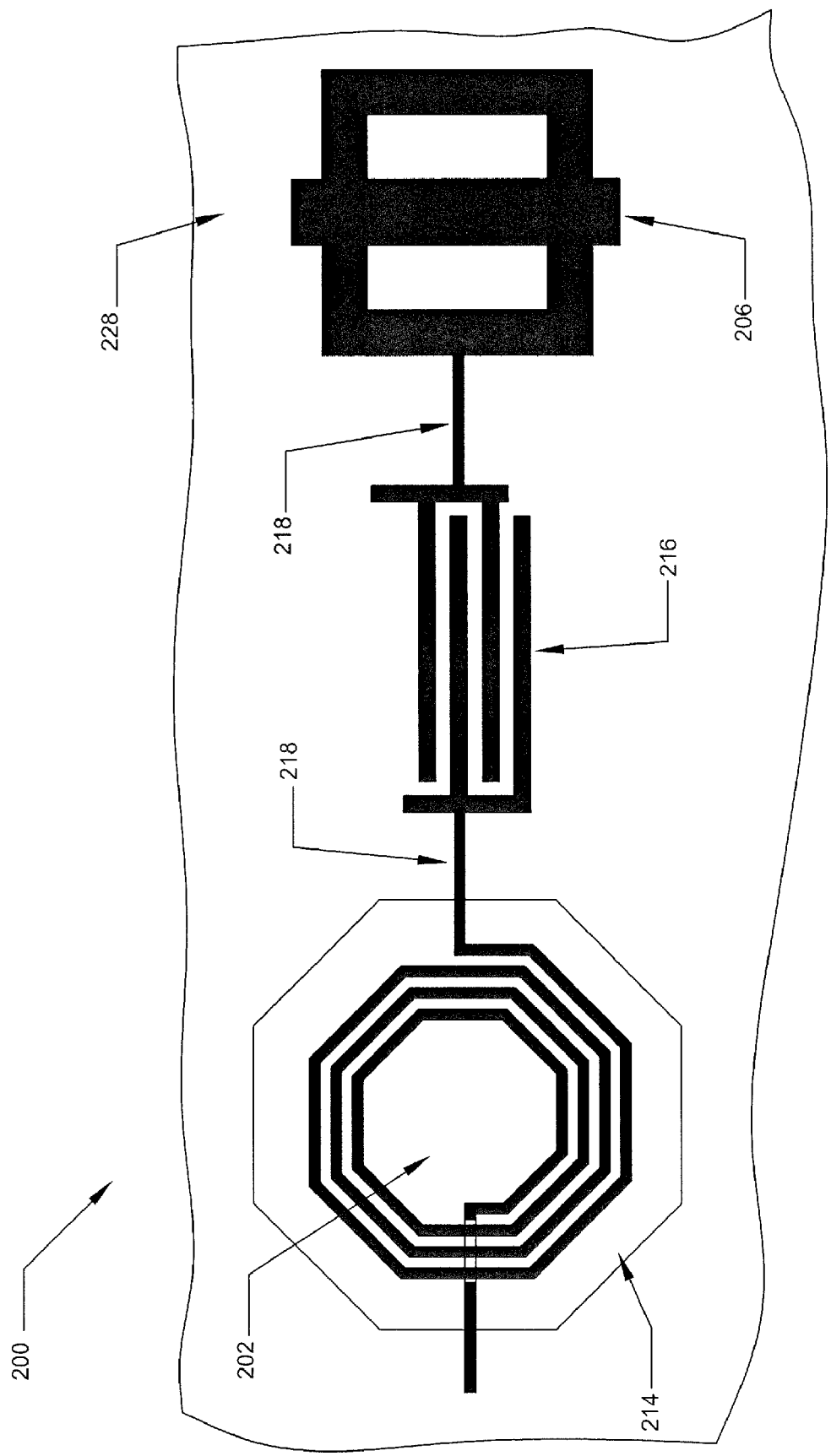
FIG. 2 is a top plan view illustrating a portion of a conventional LC-VCO.
Figure 3:
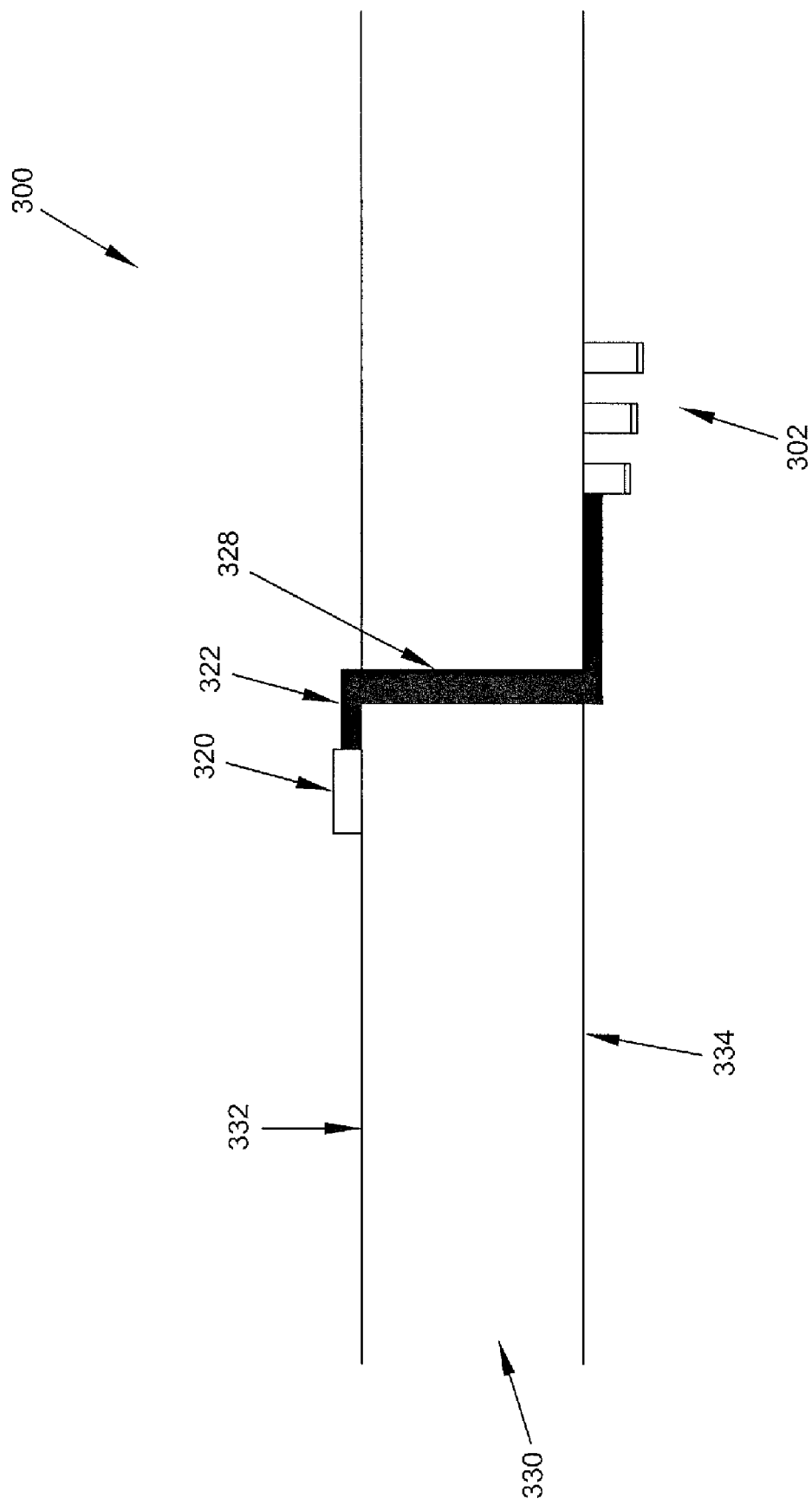
FIG. 3 is a cross-sectional view of a three-dimensional integrated circuit design according to an embodiment of the present disclosure.

With reference to FIG. 3, a cross-sectional view of a three-dimensional integrated circuit design according to an embodiment of the present disclosure is shown. The integrated circuit 300 includes a substrate 330. In some embodiments, the substrate 330 is a semiconductor wafer. In another embodiment, the substrate is a semiconductor die. In an embodiment, the substrate 330 may be a p-type substrate. The substrate 330 may be formed from a material including, but not limited to, a Group IV elemental or compound semiconductor or a Group III-V semiconductor. The substrate 330 may include silicon. The substrate 330 may include another elementary semiconductor such as, for example, germanium. The substrate 330 may also include a compound semiconductor such as, for example, silicon carbide, gallium arsenide, indium arsenide or indium phosphide.

Substrate 330 has a first surface 332 and a second surface 334. In FIG. 3, first surface 332 and second surface 334 are opposite exposed surfaces of substrate 330. However, one of ordinary skill in the art understands that subsequent processing steps may add one or more additional layers above the surface 332 or below the surface 334, prior to completion of the IC fabrication. Substrate 330 includes an opening 322. The opening 322 may extend through the first surface 332 and the second surface 334 of the substrate 330. The opening 322 may be formed by any suitable method. For example, the opening 322 may be formed by anisotropic etching, such as a dry etch. The opening 322 may be exposed from the backside of the substrate 330 and through the second surface 334 by, for example, a backside polishing process such as chemical mechanical polishing (CMP) to planarize the second surface 334 and thin the substrate 330. In some embodiments, opening 322 may have substantially straight side walls. For example, opening 322 may be formed with sidewalls perpendicular to first surface 322 and second surface 324. In an alternative embodiment, opening 322 may be formed using a process having partial anisotropic etching and partial isotropic etching such that opening 322 includes a predetermined tapered profile. The opening 322 may have different geometries and dimensions for enhanced performance in various embodiments.

The three-dimensional integrated circuit 300 may include a conductive material substantially filling the opening 322 to form a conductive through-substrate-via (TSV) 328. For example, the conductive material may include copper, aluminum, or other conductive material. The conductive material may be filled in the opening 322 using any suitable process including, but not limited to, electro plating, chemical vapor deposition (CVD), physical vapor deposition (PVD), sputtering, or the like. In some embodiments, a conformal diffusion barrier layer (not shown) may be formed, covering the sidewalls and bottom of the opening 322. For example, diffusion barrier layer (of TiN, TaN, or the like) may be formed using physical vapor deposition (PVD). In some embodiments, a seed layer (not shown), which may include copper, may be formed on diffusion barrier layer (not shown) by, for example, electroless plating. As discussed above, the second surface 324 may be polished by using for example, CMP, to expose the TSV 328. In another embodiment, the TSV may be exposed using a back etching process.

In some embodiments, the semiconductor substrate 330 may include an epitaxial layer (not shown). For example, the substrate may have an epitaxial layer overlying a bulk semiconductor. In other embodiments, the substrate may include stressor material regions for performance enhancement. For example, the epitaxial layer may include semiconductor materials having a lattice structure different from those of the bulk semiconductor such as a layer of silicon germanium overlying a bulk silicon, or a layer of silicon overlying a bulk silicon germanium formed by a process including selective epitaxial growth (SEG). Furthermore, the substrate 330 may include a semiconductor-on-insulator (SOI) structure. In various examples, the substrate 330 may include a buried oxide (BOX) layer formed by a process such as separation by implanted oxygen (SIMOX).

In some embodiments, the three dimensional integrated circuit 300 includes at least one active device 320 (e.g., transistor or diode) disposed on the first surface of the semiconductor substrate. For example, the substrate 330 may include various microelectronic devices such as a metal-oxide-semiconductor field effect transistor (MOSFET) including complementary MOSFET (CMOS), metal semiconductor field effect transistor (MOSFET), imaging sensor including CMOS imaging sensor (CIS) or the like. The substrate 330 may include other suitable active and/or passive devices. For example the substrate 330 may include one or more capacitors, such as a MOM capacitor or a MIM capacitor, a varactor, or a resistor. The substrate 330 may also include various isolation regions (e.g., shallow trench isolation regions) configured to separate various devices from each other for proper isolation. One or more circuits 300 may be provided, which may include filters, oscillators or the like, As illustrated in FIG. 3, the substrate 330 may include an inductor 302 disposed on the second surface 334 of the substrate 330. In an embodiment, the inductor 302 may be a planar inductor disposed on the second surface 334 of the substrate 330. The inductor 302 may include a material such as, for example, aluminum or some other metal. In alternate embodiments (not shown), the inductor 302 may be an air coil inductor. In another embodiment (not shown), the inductor 302 may include a material patterned in a helical, toroidal or a watch spring coil shape. In an embodiment, the inductor 302 may be integrated into the IC fabrication process. For example, the inductor may include a first planar metal winding layer formed in a trench of a first dielectric layer, a second planar metal layer formed in a trench of a second dielectric layer above the first dielectric layer, and a first conductive via structure in a via layer interposed between the first and second dielectric layers for interconnecting the first and second planar metal layers. The TSV 328 may be electrically coupled to the inductor 302 and the active circuit 320. Because the inductor 302 and active device layer 320 are isolated from each other on opposite sides of the bulk semiconductor substrate 330, it is not necessary to provide a large in-plane distance between them. In some embodiments, there is a small in-plane displacement between the location of the inductor 302 and the location of the active device 320, as shown in FIG. 3. Further, there is no need for a guard ring around the inductor, and the guard ring may be omitted, as shown in FIG. 3. Thus, the overall footprint of the IC can thus be reduced. In other embodiments (not shown), the inductor 302 may be positioned opposite the active circuit 320, using the bulk substrate for isolation, without any lateral displacement between the two.

In some embodiments, the capacitor of the LC tank circuit is on the front (active) face 332 of the substrate, and a TSV 328 connects the capacitor to the inductor 302 on the rear face. In other embodiments described below, the TSV connecting the active face devices to the inductor 302 is itself part of the capacitor of the LC tank circuit. As illustrated in FIG. 3, the configuration of the integrated circuit 300 may improve integration density. The configuration in FIG. 3 may further reduce the parasitic capacitance incurred by the inductor to improve the Q factor of the inductor 302. The configuration shown in FIG. 3 may also reduce the substrate noise coupling between the inductor 302 and other components and thus make the use of a guard ring surrounding the inductor 302 unnecessary.

Figure 4:
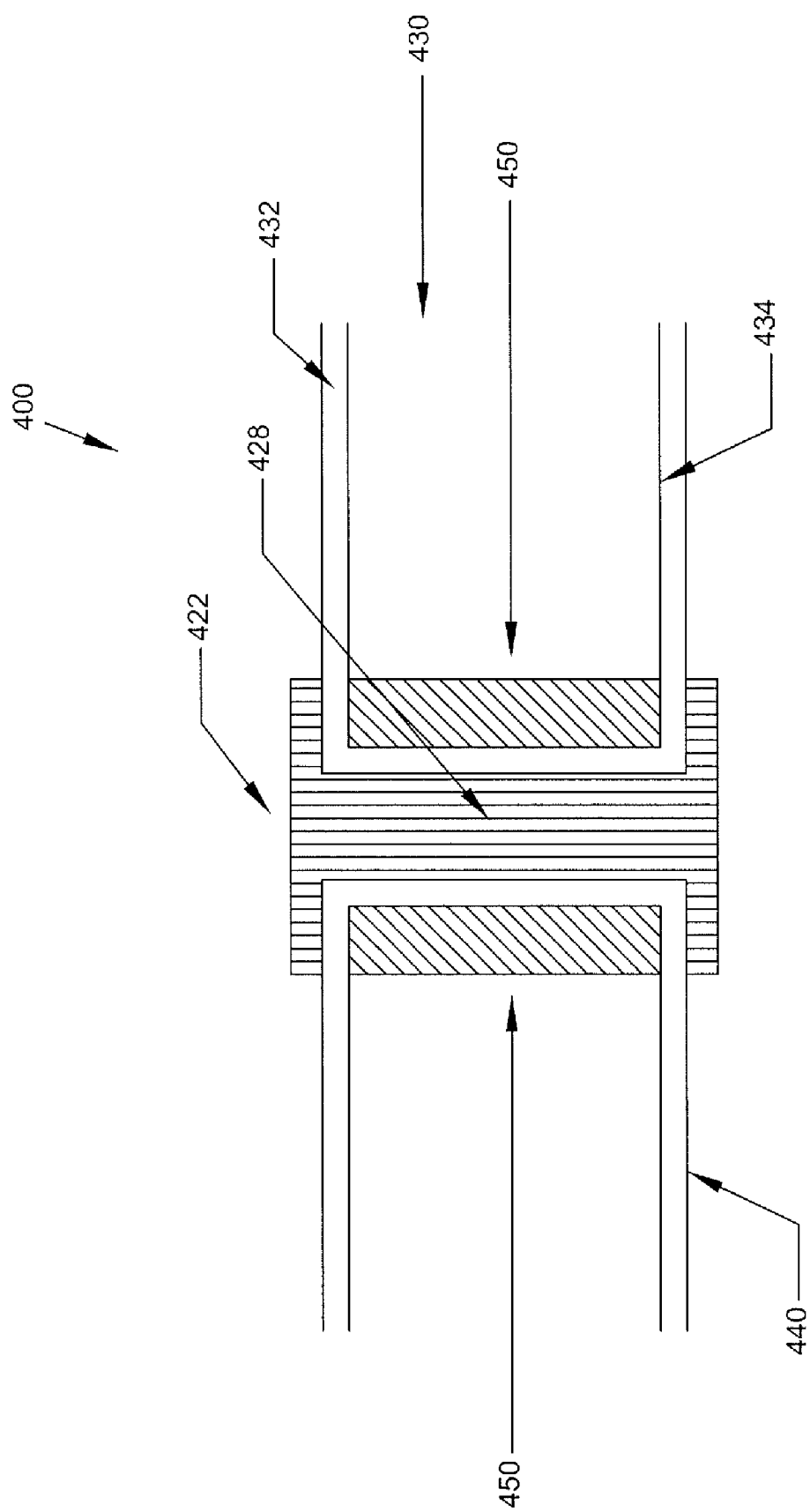
FIG. 4 is a cross-sectional view of a varactor according to an embodiment of the present invention.
Figure 6:
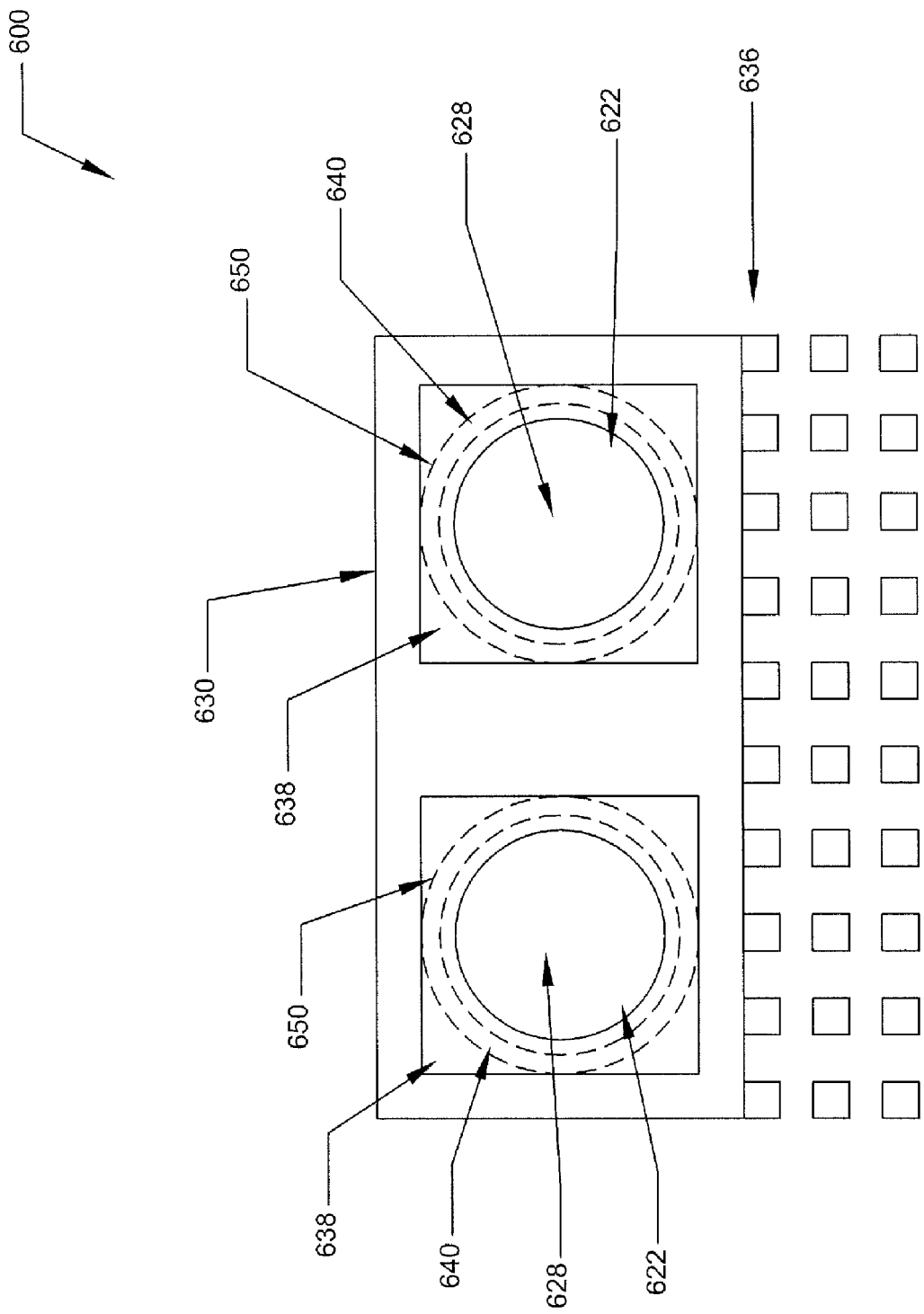
FIG. 6 is a top plan view illustrating a portion of an LC-VCO according to an embodiment of the present disclosure.

With reference to FIG. 4, a cross-sectional view of a varactor 400 is illustrated. In FIG. 6, a top plan view illustrating a portion of a substrate including two of the TSV varactors 400 of FIG. 4 is shown. The varactor 400 may be included in the LC-tank circuit of the three dimensional IC shown in FIG. 3, in the position occupied by TSV 328 in FIG. 3. The varactor 400 includes a substrate 430. The substrate 430 may be a semiconductor wafer or a semiconductor die. In some embodiments, the substrate 330 may be a p substrate. The substrate 430 may be formed from a material including, but not limited to, a Group IV elemental or compound semiconductor or a Group III-V semiconductor. The substrate 330 may include silicon. The substrate 430 may include another elementary semiconductor such as, for example, germanium. The substrate 430 may also include a compound semiconductor such as, for example, silicon carbide, gallium arsenide, indium arsenide or indium phosphide.

Substrate 430 has a first surface 432 and a second surface 434 on opposite surfaces of semiconductor substrate 430. Substrate 430 includes an opening 422 (622, FIG. 6). The opening 422 may extend through the first surface 432 and the second surface 434 of the substrate 430. As discussed above, the opening 422 may be formed by any of a variety of methods. The varactor 400 may include an impurity implanted region 450 (650) disposed in the substrate surrounding the opening 422. If the via is circular in cross section, then the impurity region 450 (650) is shaped as an annular cylinder. If the via is square in cross section, then the impurity region is a square shell. In some embodiments, the impurity implanted region 450 (650) may be a deep n-well formed in a p-type substrate. In another embodiment, the impurity implanted region 450 (650) may be a p-well formed in a n-type substrate. The impurity implanted region 450 (650) is formed by ion implantation. In an embodiment, the impurity implanted region 450 (650) may be formed using anisotropic ion implantation. In a preferred embodiment, the impurity implanted region 450 (650) may be formed using tilted n-type ion implanting (i.e., anisotropic implantation with a non-zero angle between the ion source and the side walls of the opening).

The varactor 400 may include a dielectric layer 440 (640) disposed on a side surface of the opening 422 (622). In a preferred embodiment, the dielectric layer 440 (640) is disposed on the implanted side wall surrounding the opening 422 (622). The dielectric layer 440 (640) may include a dielectric material such as, for example, silicon oxide, silicon nitride, silicon oxynitride, spin-on-glass, fluoride-doped silicate glass, carbon doped silicon oxide, xerogel, aerogel, amorphous fluorinated carbon, parylene, BCB, polyimide and/or other suitable materials. The dielectric layer 440 (640) may be formed by any suitable method including, for example, atomic layer deposition (ALD), chemical vapor deposition (CVD), thermal oxidation or other suitable processes. In an embodiment, the dielectric layer 440 (640) may be formed on the first surface 332 and/or the second surface 334 of the substrate 330.

The varactor 400 includes a conductive material substantially filling the opening 422 (622) to forma conductive through-substrate-via (TSV) 428 (628). For example, the conductive material may include copper, aluminum or polycrystalline silicon, for example. The conductive material may be filled in the opening 422 (622) using any suitable process including, but not limited to, CVD, PVD, or electro plating. The varactor 400 may include the heavily doped impurity implanted region 450 (650) surrounding the opening 422 (622).

In some embodiments, one conductor of the varactor 400 may include the TSV 428 (628). The capacitance of the varactor 400 can be changed or tuned by varying a bias voltage applied to the conductor 428 (628). A P-N junction is formed between the implanted region 450 (650) and the substrate 430, so a deep N+ impurity region 450 (650) may be used with a p-type substrate 430. In some embodiments, at a negative bias voltage and/or at a bias voltage less than a flatband voltage, the varactor 400 will operate in an accumulation mode as the negative charge on the gate attracts holes from the substrate to the dielectric-semiconductor interface. In some embodiments, at a positive bias voltage higher than a flatband voltage, the varactor 400 will operate in a depletion mode as the positive charge on the gate pushes the mobile holes into the substrate, depleting the semiconductor of mobile carriers at the dielectric-semiconductor interface and resulting in a negative charge build up in the space charge region of the semiconductor. Thus, the depletion zone width will increase with higher positive bias voltages. A flatband voltage is the voltage separating the accumulation and depletion regimes. The bias voltage may be varied or swept between −Vdd and Vdd. The bias voltage may be supplied by an external voltage source. The bias voltage may be supplied to the varactor 400 by a bias terminal (not shown), electrically coupled to the TSV 428 (628). In another embodiment, the bias terminal (not shown) may be electrically coupled to the impurity implanted region 450. In an embodiment, the bias voltage source (not shown) may be configured to provide a bias voltage substantially between −6 and −14 volts. It will be apparent to one skilled in the art that the operating bias voltage is dependent on the material for substrate doping. One skilled in the art would understand that a lower operating bias voltage would be observed for a higher doped substrate.

In some embodiments, the LC tank circuit includes an inductor on a side of the semiconductor substrate opposite the active face of the substrate, and the capacitor of the tank circuit is provided by the TSV 428 (628). In FIG. 6, contact structure 638 is formed above and below the TSV 628 and provide a conductive path for electrical signals to pass from a device (e.g., 320, FIG. 3) disposed on a first surface (e.g., 332) of the substrate 330 through the TSV 628 and to a device (e.g., 302) disposed on a second surface (e.g., 334) of the substrate (330). Additionally, a plurality of contact structures 636 are illustrated as disposed adjacent the impurity implanted region 638. In some embodiments, the contact structures 636 may provide a contact for the bias voltage source. In another embodiment, the contact structures 636 may provide a contact for a ground in an RF application where the RF signal wave would propagate between the TSV and the impurity implanted region. Contact structure 638 and contact structures 636 may include a material such as, for example, tungsten, polysilicon, aluminum, copper, ruthenium and/or any combination thereof. Contact structure 638 and contact structures 636 may include a conductive pad.

Figure 5:
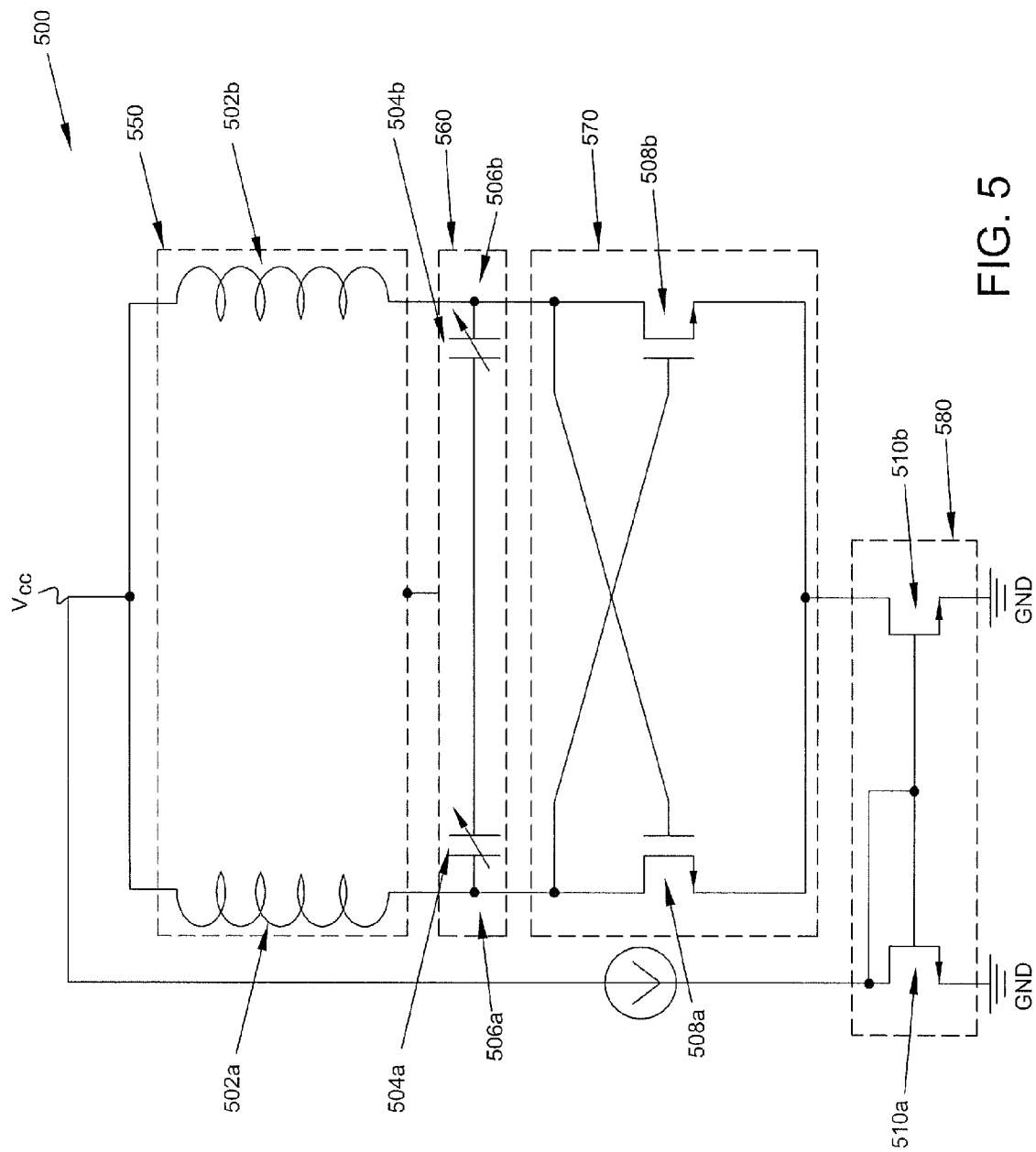
FIG. 5 is a circuit diagram of an LC-VCO according to an embodiment of the present invention.

FIG. 5 illustrates a circuit diagram showing an LC-VCO including a varactor of the type shown in FIG. 4. As illustrated in FIG. 5, LC-VCO 500 is connected to a supply potential Vcc and a ground potential GND. An inductor section 550, a varactor section 560, a negative resistance section 570 and a current regulation section 580 are connected with one another in that manner from the supply potential line Vcc towards the ground potential line GND in the LC-VCO 500. The inductor section 550 is provided with two spiral inductors 502a and 502b. As shown in FIG. 3, an inductor 302 may be disposed on a second surface 334 (FIG. 3) of a substrate 330 (FIG. 3). In some embodiments, depending on the inductance to be provided for a given design, the inductors 502a and 502b may include a plurality of planar coils in two or more layers, connected by vias. In some embodiments, the inductors 502a and 502b are disposed on a second surface 334 (FIG. 3) of a substrate 330 (FIG. 3). Ends of the spiral inductors 502a and 502b are connected to the supply potential Vcc and the other ends are connected to output terminals 506a and 506b.

As illustrated, the varactor section 560 is provided with two varactors 504a and 504b. As illustrated in FIG. 4, varactors 504a and 504b may be formed from a TSV 428, an impurity implanted region 450 disposed surrounding the TSV 428 and a dielectric layer 440 disposed between the impurity implanted region 450 and the TSV 428 (FIG. 4). One end of the varactor 504a, such as a well electrode, may be connected to the output terminal 506a, while one end of the varactor 504b, such as a well electrode, may be connected to the output terminal 506b. The varactors 504a and 504b may be connected to each other at the other ends thereof, e.g., the conductive contact, to which a bias voltage may be applied.

In some embodiments, varactor section 560 includes a plurality of varactors which may be the same as each other, or may be different from each other. For example, in one embodiment, varactor 504a is formed from a TSV 428, an impurity implanted region 450 disposed surrounding the TSV 428 and a dielectric layer 440 disposed between the impurity implanted region 450 and the TSV 428 (FIG. 4); and varactor 504b is a conventional varactor.

In another embodiment, TSV varactor(s) 504a and/or 504b as shown in FIG. 4 is/are electrically coupled to a fixed capacitor, such as, for example, a MOM or MIM capacitor, to increase the capacitance in the varactor section 560 and improve the varactor biasing in the varactor section 560 of the LC-VCO circuit 500.

In another embodiment, any desired number of additional TSV varactors (not shown) as described with reference to FIG. 4 may be included in the varactor section 560 of the LC-VCO 500. In a further embodiment, the inductance (L) of the inductor region 550 may be increased to provide a higher Q factor. For example, inductor 502a and/or 502b may include a greater number of windings to increase L.

The negative resistance section 570 is provided with NMOS transistors 508a and 508b. As illustrated, the NMOS transistor 508a has the drain connected to the output terminal 506a and the gate connected to the output terminal 506b. On the other hand, as shown in FIG. 5, the NMOS transistor 508b has the drain connected to the output terminal 506b and the gate connected to the output terminal 506a. In FIG. 4, the components of the negative resistance section 570 are disposed on the first surface 432 of the substrate 430 (FIG. 4). The current regulation section 580 is provided with NMOS transistors 510a and 510b. As illustrated in FIG. 5, the N-channel transistor 510a has the drain connected to the sources of the NMOS transistor 508a and the NMOS transistor 508b. Additionally, the NMOS transistor 510a has the source connected to the ground potential line GND and the gate to which a bias voltage is applied. The NMOS transistor 510b has the drain connected to the sources of the NMOS transistor 508a and the NMOS transistor 108b. Additionally, as shown in FIG. 5, the NMOS transistor 110b has the source connected to the ground potential line GND and the gate to which a bias voltage is applied. In FIG. 5, the components of the current regulation section 580 are disposed on the first surface 432 of the substrate 430 (FIG. 4).

Figure 7:
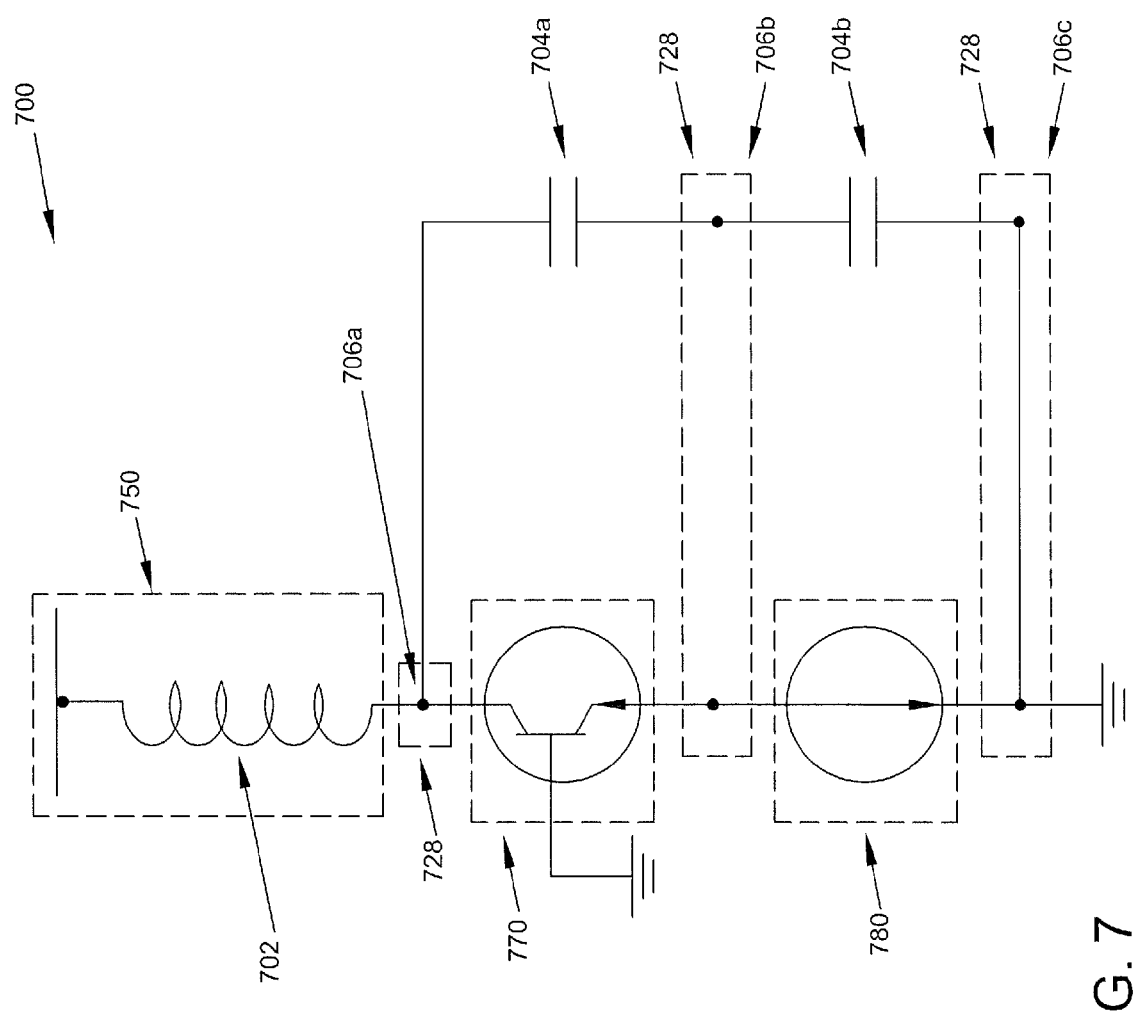
FIG. 7 is a circuit diagram of an LC-VCO according to an embodiment of the present invention.

In FIG. 7 shows a circuit diagram of an LC-VCO. As illustrated in FIG. 7, LC-VCO 700 may be a Colpitts-type oscillator with simplified biasing. In a Colpitts oscillator 700, the two capacitors and one inductor determine the frequency of oscillation. The driver for oscillation is taken from a voltage divider made by the two capacitors. In using the Colpitts oscillator 700 as a variable frequency oscillator, a variable inductance may be used for tuning, or a third variable capacitor (not shown) may be connected in parallel to the inductor 702. LC-VCO 700 may include an inductor section 750 including an inductor 702. As shown in FIG. 3, the inductor 702 may be disposed on a second surface 334 (FIG. 3) of a substrate 330 (FIG. 3). An end of inductor 702 may be electrically coupled to an output terminal 706a where the output terminal 706a includes a TSV 728. The TSV 728 may be of the type described above with reference to FIG. 4, a description of which is not repeated, for purpose of brevity.

Negative resistance section 770 may include a bipolar junction transistor where, as illustrated, the bipolar junction transistor has the collector end connected to an output terminal and the emitter end connected to an output terminal and the base connected to ground. In some embodiments, each output terminal includes a TSV 728. In some embodiments, the components of the negative resistance section 770 are disposed on a first surface 432 (FIG. 4) of a substrate 430 (FIG. 4). In some embodiments, negative resistance section 770 may include a MOS field effect transistor (MOSFET) or another active device such as, for example, a metal semiconductor field effect transistor (MOSFET). As illustrated in FIG. 7, LC-VCO 700 may include a current regulation section 780 connected to an output terminal at each end. In some embodiments, the components of the current regulation section 780 are disposed on a first surface 432 (FIG. 4) of a substrate 430 (FIG. 4). In one embodiment, each output terminal connected to each end of current regulation section 780 includes a TSV 728. In FIG. 7, the capacitance in the LC-VCO 700 conventionally supplied by capacitors 704a and 704b is supplied by the TSV 728 disposed at each output terminal (706a, 706b and 706c) of the LC-VCO 700 as discussed above. The TSV 728 configuration forms a capacitive voltage divider with TSV to TSV capacitance. Thus, an improvement in integration density may be achieved as capacitors 704a and 704b may be unnecessary in LC-VCO 700.

Figure 8:
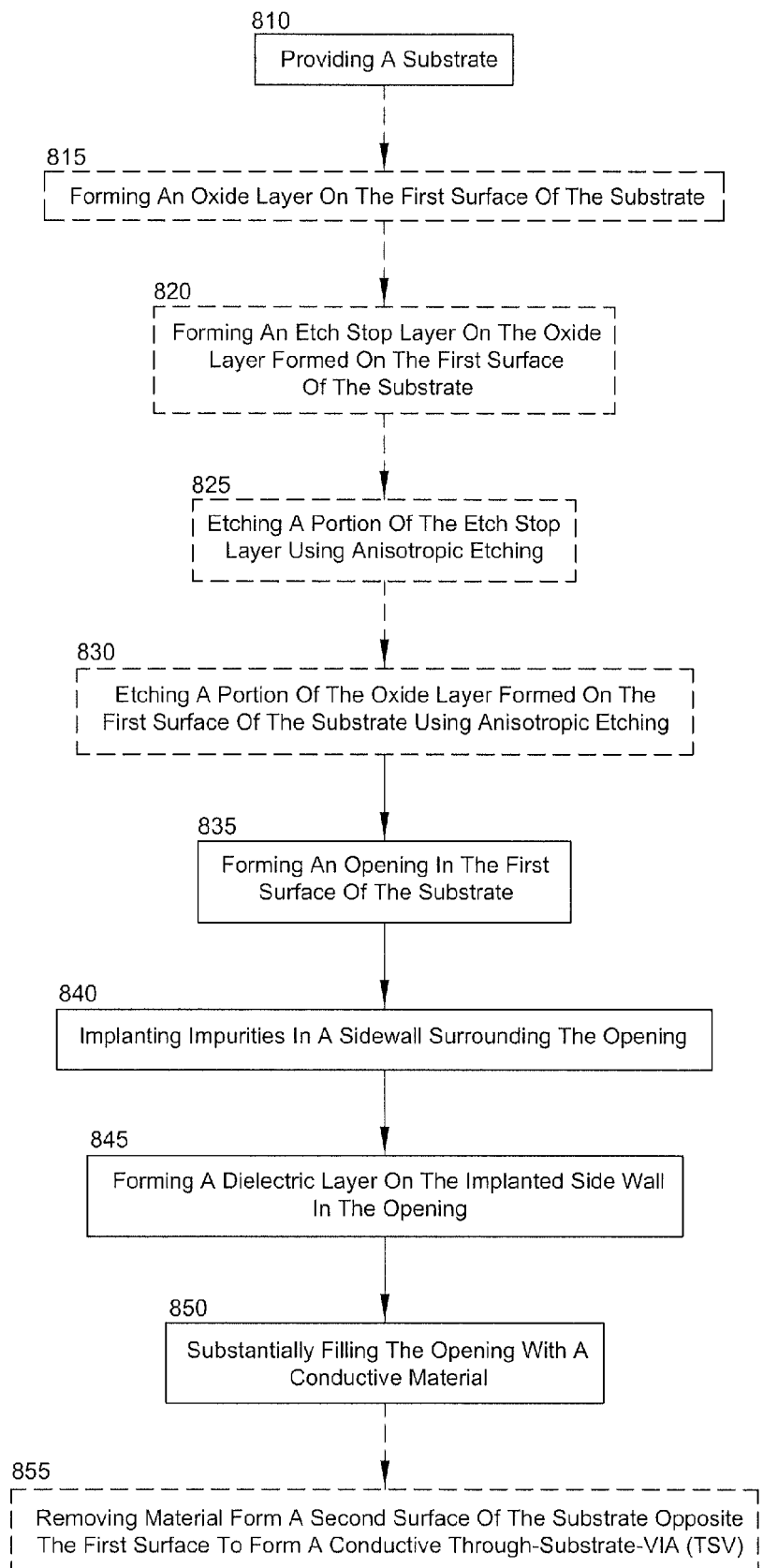
FIG. 8 is a flow chart illustrating a method of forming a varactor according to an embodiment of the present disclosure.

FIG. 8 shows a flow chart illustrating a method of forming a varactor. At block 810, a substrate is provided. In the illustrated embodiment, blocks 815 through 830 are shown as optional steps for forming an opening in a first surface of the substrate. However, one of ordinary skill in the art understands that other techniques may be used to form the opening.

At block 815, a dielectric layer may be formed on the first surface of the substrate. The dielectric layer may include a dielectric material such as, for example, silicon oxide, silicon nitride, silicon oxynitride, spin-on-glass, fluoride-doped silicate glass, carbon doped silicon oxide, xerogel, aerogel, amorphous fluorinated carbon, parylene, BCB, polyimide and/or other suitable materials. The dielectric layer may be formed by any method known in the art including, for example, atomic layer deposition (ALD), chemical vapor deposition (CVD), thermal oxidation or other suitable processes. In an embodiment, the dielectric layer may be an oxide layer.

At block 820, an etch stop layer may be formed on the dielectric layer formed on the first surface of the substrate. The etch stop layer may be formed by any suitable process. The etch stop layer material may be a material that is resistant to the particular etching process used for any overlying material layer. For example, the etch stop layer may be formed from silicon nitride, silicon carbide, silicon germanium or other suitable material.

At block 825, a portion of the etch stop layer may be etched by any suitable method. For example, a portion of the etch stop layer may be etched using anisotropic etching. A portion of the etch stop layer may be etched by chemical etching, plasma etching or a combination thereof. In an embodiment, a photolithographic process may be used where a photo mask containing the pattern of a structure to be fabricated is created, then, after formation of a etch stop layer within which a desired feature is to be formed, the etch stop layer is coated with a light sensitive material called photoresist or resist. In an embodiment, the photoresist may be patterned to form an opening in the substrate. The photo resist coated etch stop layer may be exposed to ultraviolet light through the mask, thereby transferring the pattern from the mask to the photo resist. The etch stop layer may be etched to remove the portion of the etch stop layer unprotected by the photo resist, and then the remaining photo resist is stripped.

At block 830, a portion of the dielectric layer may be etched by any suitable method. For example, a portion of the dielectric may be etched using anisotropic etching. A portion of the etch stop layer may be etched by chemical etching, plasma etching or a combination thereof. As discussed above, a photolithographic process may be used in another embodiment. In an embodiment, the photoresist may be patterned to form an opening in the substrate and through the etch stop layer and the dielectric layer.

At block 835, an opening may be formed in a first surface of the substrate. The opening may extend through the first surface and the second surface of the substrate. The opening may be formed by any suitable method. For example, the opening may be formed by anisotropic etching. The opening may be exposed from the backside of the substrate and through the second surface by, for example, a backside polishing process such as chemical mechanical polishing (CMP) to planarize the second surface of the substrate. In a preferred embodiment, the sidewalls of the opening are substantially straight. For example, the sidewalls of the opening may be perpendicular to the first surface and the second surface of the substrate. In another embodiment, the opening may be formed using a process having partial anisotropic etching and partial isotropic etching such that the opening includes a predetermined tapered profile. The opening may have different geometries and dimensions for enhanced performance in various embodiments.

At block 840, impurities may be implanted in a sidewall of the substrate surrounding the opening. In an embodiment, the impurity implanted region may be a deep n-well formed in a p-type substrate. In another embodiment, the impurity implanted region may be a p-well formed in a n-type substrate.

At block 845, a dielectric layer may be formed on the implanted side wall in the opening. The dielectric layer may be formed by any suitable method including, for example, ALD, CVD, thermal oxidation or other suitable processes. The dielectric layer may include a dielectric material such as, for example, silicon oxide, silicon nitride, silicon oxynitride, spin-on-glass, fluoride-doped silicate glass, carbon doped silicon oxide, xerogel, aerogel, amorphous fluorinated carbon, parylene, BCB, polyimide and/or other suitable materials. In an embodiment, the dielectric layer may be formed on the first surface and/or the second surface of the substrate.

A block 850, a conductive material may be deposited in the opening to substantially fill the opening. The conductive material may be filled in the opening using any suitable process including, but not limited to, electro plating, PVD or CVD. In an embodiment, the conductive TSV may be formed in a method similar to formation of vias in a dual damascene process, where an opening is formed, the conductive material is filled and a chemical mechanical polishing process is applied to remove excess conductive material and planarize the surface. The conductive material may include copper, aluminum, polysilicon, or the like. In an embodiment, a diffusion barrier layer may be blanket formed, covering the sidewalls and bottom of the opening. For example, diffusion barrier layer may be formed using physical vapor deposition (PVD). In an embodiment, a seed layer, and preferably including copper, may be formed on diffusion barrier layer by, for example, electroless plating.

At block 855, conductive material may be removed from a second surface of the substrate opposite the first surface to form a conductive TSV. As discussed above, the second surface may be polished and planarized by using for example, CMP, to expose the TSV. In another embodiment, the TSV may be exposed using a back etching process.

Figure 9:
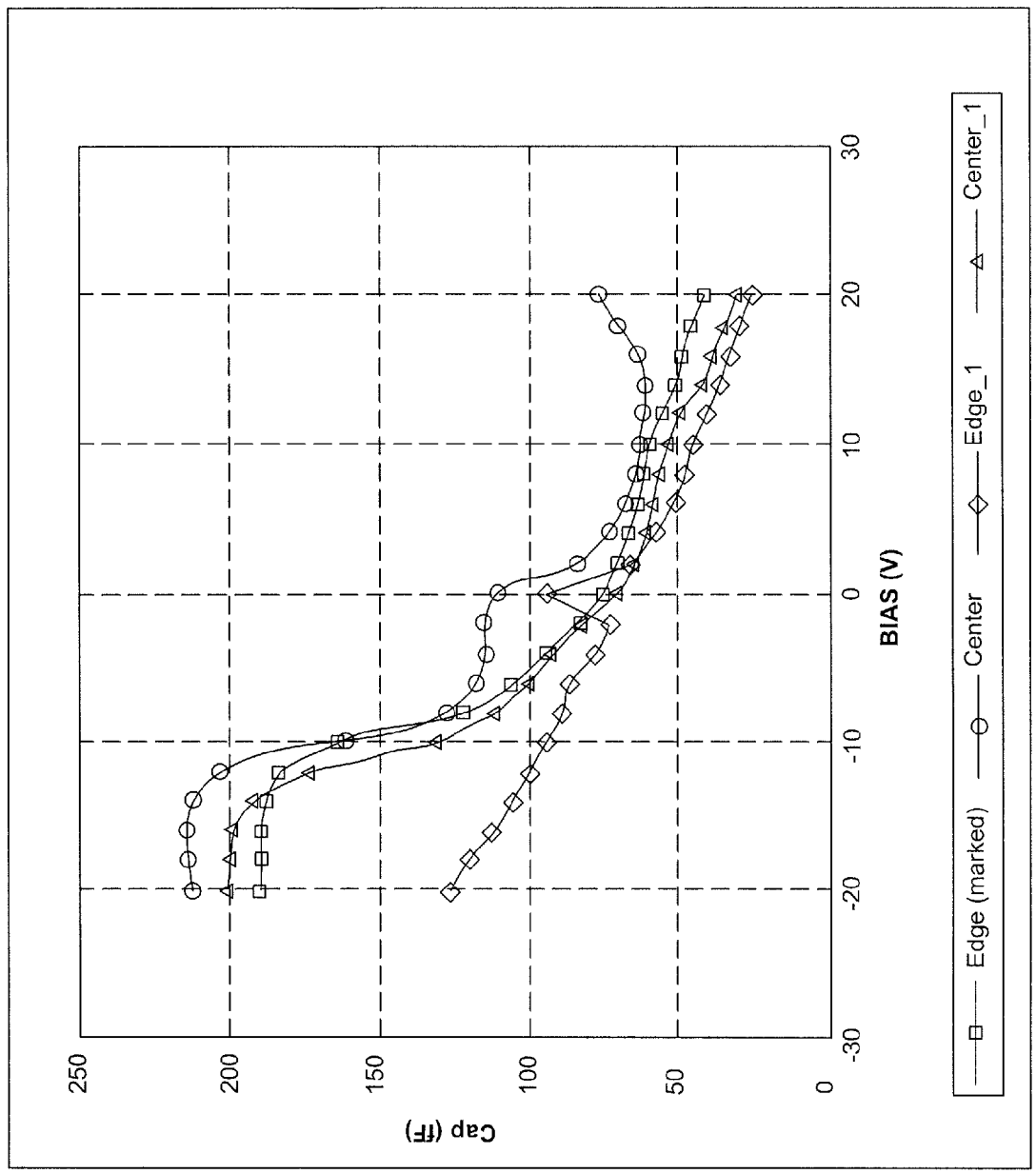
FIG. 9 is a plot showing the bias control characteristics of a varactor according to an embodiment of the present invention.

FIG. 9 is a plot showing a non-limiting example of the bias control characteristics of a varactor as shown in FIG. 4. The varactor was also electrically coupled to an inductor on the second surface and an active circuit on the first surface in an LC-VCO as described in FIG. 3. A biasing terminal was electrically coupled to a biasing voltage source and the TSV to supply a biasing voltage to the varactor. The biasing voltage was supplied to the TSV, causing the varactor to operate as illustrated. The capacitance was measured at various locations in the TSV including the edge of the TSV adjacent the first surface of the substrate, the edge of the TSV adjacent the second surface of the substrate, the center of the TSV about the first surface of the substrate and at the center of the TSV about the second surface of the substrate. As shown in FIG. 9, the maximum capacitance of the varactor was about 210 fentofarads and the minimum capacitance of the varactor was about 70 fentofarads. As FIG. 9 illustrates, at a voltage greater than approximately −6V, the varactor operated in a depletion mode and at a voltage less than approximately −14V, the varactor operated in an accumulation mode. The varactor operated with a tuning range of approximately −6V to −14V to change the capacitance of the varactor between approximately 210 fentofarads and 70 fentofarads and to change the resonant frequency of the LC-VCO. The above example is illustrative only and is not intended to limit the scope of the disclosure. It will be apparent to one skilled in the art that various modifications and variations can be made. For example, the operating bias voltage is dependent on the material for substrate doping. One skilled in the art would understand that a lower operating bias voltage would be observed for a higher doped substrate.

As shown by the various configurations, embodiments and examples illustrated in FIGS. 1-9, a three-dimensional integrated circuit, varactor and method of forming the same have been described.

While preferred embodiments of the present invention have been described, it is to be understood that the embodiments described are illustrative only and that the scope of the invention is to be defined the appended claims when accorded a full range of equivalents, many variations and modifications naturally occurring to those of skill in the art from a perusal hereof.

Furthermore, the above examples are illustrative only and are not intended to limit the scope of the disclosure as defined by the appended claims. It will be apparent to those skilled in the art that various modifications and variations can be made in the varactors, integrated circuits and methods of the present subject matter without departing from the spirit and scope of the disclosure. Thus, it is intended that the claims cover the variations and modifications that may be made by those of ordinary skill in the art.

What we claim is:

1. A varactor for a voltage-controlled oscillator (VCO), comprising:
   a) a semiconductor substrate having an opening extending through a first surface and a second surface of the substrate, wherein the first surface and the second surface are opposite surfaces of the substrate;
   b) a dielectric layer disposed on a side surface in the opening;
   c) a conductive material formed on the dielectric layer and substantially filling the opening to form a conductive through-substrate-via (TSV); and
   d) an impurity implanted region disposed in the substrate surrounding and directly contacting the TSV and the dielectric layer and substantially extending from the first surface to the second surface of the substrate.

2. The varactor of claim 1, wherein the impurity implanted region is a deep n-well.

3. The varactor of claim 1, wherein the substrate comprises a material selected from the group consisting of: Group IV elemental or compound semiconductors and Group III-V semiconductors.

4. The varactor of claim 3, wherein the substrate comprises silicon.

5. The varactor of claim 1, further comprising:
   a bias terminal electrically coupled to the TSV and a bias voltage source.

6. The varactor of claim 5, wherein the bias voltage source is configured to provide a bias voltage substantially between −6 and −14 volts.

7. The varactor of claim 1, further comprising:
   a bias terminal electrically coupled to the impurity implanted region and a bias voltage source.

8. A varactor for a voltage-controlled oscillator (VCO), comprising:
   a) a semiconductor substrate having an opening extending through a first surface and a second surface of the substrate, wherein the first surface and the second surface are opposite surfaces of the substrate;
   b) a dielectric layer disposed on a side surface in the opening;
   c) a conductive material formed on the dielectric layer and substantially filling the opening to form a conductive through-substrate-via (TSV);
   d) an impurity implanted region disposed in the substrate surrounding the TSV and the dielectric layer; and
   e) a connection for applying a bias voltage to the varactor;
   wherein the TSV, dielectric layer, impurity implanted region and connection form the varactor; and wherein the capacitance of the varactor may be changed by varying the bias voltage applied to the connection.

9. The varactor of claim 8, wherein the impurity implanted region is a deep n-well.

10. The varactor of claim 8, wherein the substrate comprises a material selected from the group consisting of: Group IV elemental or compound semiconductors and Group III-V semiconductors.

11. The varactor of claim 10, wherein the substrate comprises silicon.

12. The varactor of claim 8, wherein the connection is formed at the TSV and wherein the varactor further comprises a bias terminal electrically coupled to the connection and a bias voltage source.

13. The varactor of claim 12, wherein the bias voltage source is configured to provide a bias voltage substantially between −6 and −14 volts.

14. The varactor of claim 8, wherein the connection is formed in the impurity implanted region and wherein the varactor further comprises a bias terminal electrically coupled to the connection and a bias voltage source.

* * * * *

UNITED STATES PATENT AND TRADEMARK OFFICE
CERTIFICATE OF CORRECTION

PATENT NO. : 8,362,591 B2
APPLICATION NO. : 12/795734
DATED : January 29, 2013
INVENTOR(S) : Hsiao-Tsung Yen et al.

It is certified that error appears in the above-identified patent and that said Letters Patent is hereby corrected as shown below:

In the Specification

Column 5, Line 29, delete "(MOSFET)" and insert -- (MESFET) --.

Column 7, Line 8, delete "forma" and insert -- form a --.

Column 9, Line 40, delete "(MOSFET)" and insert -- (MESFET) --.

Signed and Sealed this
Fifteenth Day of October, 2013

Teresa Stanek Rea
*Deputy Director of the United States Patent and Trademark Office*